United States Patent [19]

Ito et al.

[11] Patent Number: 4,761,712
[45] Date of Patent: Aug. 2, 1988

[54] MOUNTING STRUCTURE FOR ELECTRONIC PARTS

[75] Inventors: Katsuo Ito; Takami Yamamoto; Kazunori Kinoshita, all of Nagaokakyo, Japan

[73] Assignee: Murata Manufacturing Co., Ltd., Nagaokakyo, Japan

[21] Appl. No.: 935,308

[22] Filed: Nov. 26, 1986

[30] Foreign Application Priority Data

Nov. 28, 1985 [JP] Japan ............................ 60-183746[U]
Nov. 28, 1985 [JP] Japan ............................ 60-183747[U]

[51] Int. Cl.⁴ ............................................. H02B 1/04
[52] U.S. Cl. ................................... 361/429; 361/417; 361/419
[58] Field of Search .............. 174/35 R; 361/386–389, 361/395, 399, 400, 405, 417–420, 422–424, 429

[56] References Cited

U.S. PATENT DOCUMENTS

| | | | |
|---|---|---|---|
| 2,842,660 | 7/1958 | Brown | 361/423 |
| 3,200,296 | 8/1965 | Bruestle | 361/417 |
| 3,372,307 | 3/1968 | Bedocs | 361/420 |
| 4,227,238 | 10/1980 | Saito | 361/417 |
| 4,423,466 | 12/1983 | Beun | 361/400 |

FOREIGN PATENT DOCUMENTS 0723578 2/1955 United Kingdom ............... 361/423
0906739 9/1962 United Kingdom ............... 361/419

Primary Examiner—A. D. Pellinen
Assistant Examiner—Greg Thompson
Attorney, Agent, or Firm—Wenderoth, Lind & Ponack

[57] ABSTRACT

A mounting structure for temporarily mounting electronic parts fitted into a mounting bore formed in a frame and fixedly soldered at the fitted portion thereto enhances assembly and soldering. The mounting structure includes a tongue integral with the frame, folded thereover, and positioned around the mounting bore, so that the electronic part fitted therein is elastically fixedly supported on the frame by the tongue although the mounting bore is formed slightly larger in diameter than the fitted portion of the electronic part. The electronic part is thus temporarily fixedly held in the frame for being fixedly soldered to the frame with accuracy.

3 Claims, 4 Drawing Sheets

MOUNTING STRUCTURE FOR ELECTRONIC PARTS

BACKGROUND OF THE INVENTION

1. Field of the Invention

The present invention relates to a mounting structure for electronic parts, and more particularly to a mounting structure for temporarily fixing a connector terminal or a feedthrough capacitor on a frame when it is intended to soldered to the frame of a community antenna television system (CATV) converter or a television electronic tuner.

2. Description of the Prior Art

Referring to FIG. 19, a conventional mounting structure for mounting a connector terminal 23 to a frame 21 of electronic equipment is shown, and in FIG. 20, the same for mounting a feedthrough capacitor 24 to the frame 21 is shown, in which the connector terminal 23 or the depicted feedthrough capacitor 24 is fitted at its smaller diameter portion 23a or 24a into a mounting bore 22 formed in the frame 21, so that the fitted portion can be fixedly soldered thereto.

In such structure, the mounting bore 22 is made slightly larger in diameter than the smaller diameter portion 23a or 24a for the connector terminal 23 or the feedthrough capacitor 24, thereby fitting the terminal 23 or capacitor 24 into the mounting bore 22 with ease.

Therefore, the connector terminal 23 or the feedthrough capacitor 24 is often mounted on the conventional frame 21 at an undesirable slant with respect to the surface thereof. Such misalignment arises owing to looseness or to vibrations or the like during the soldering.

Also, there is a case where a plurality of terminals are mounted continuously relatively close to each other on the frame.

In that case, the previously soldered portion of the former connector terminal 23 or feedthrough capacitor 24 may be unsoldered because of being subjected through the frame 21 to the heat generated when the latter connector terminal 23 or feedthrough capacitor 24 being soldered to the frame, whereby the previously mounted connector terminal 23 or feedthrough capacitor 24 may escape from the frame 21.

Hence, in order to eliminate such problems, a clip-like jig is used to temporarily fix the connector terminal 23 or feedthrough capacitor 24 to the frame.

Such jig, however, is troublesome to mount on or dismount from the frame and is inferior as to work efficiency. Also, there are the drawbacks that the jig may absorb the heat for soldering, or the working space may be restricted.

SUMMARY OF THE INVENTION

A first object of the invention is to provide a mounting structure for electronic parts, that can keep them in a desired position with respect to a frame without using any particular jig for fixedly retaining them for soldering.

A second object of the invention is to provide a mounting structure for electronic parts that temporarily fixes them with respect to the frame, thereby improving the work efficiency of soldering.

A third object of the invention is to provide a mounting structure for electronic parts that uses a material integral with the frame for reduction of the manufacturing cost.

A fourth object of the invention is to provide a mounting structure for electronic parts that is suited for fixedly soldering them to the frame simultaneously with the dip soldering thereof.

The above and other objects and features of the invention will appear more fully hereinafter from a consideration of the following description taken in connection with the accompanying drawing wherein one example is illustrated by way of explication.

DESCRIPTION OF THE PREFERRED EMBODIMENT

Figure 1:
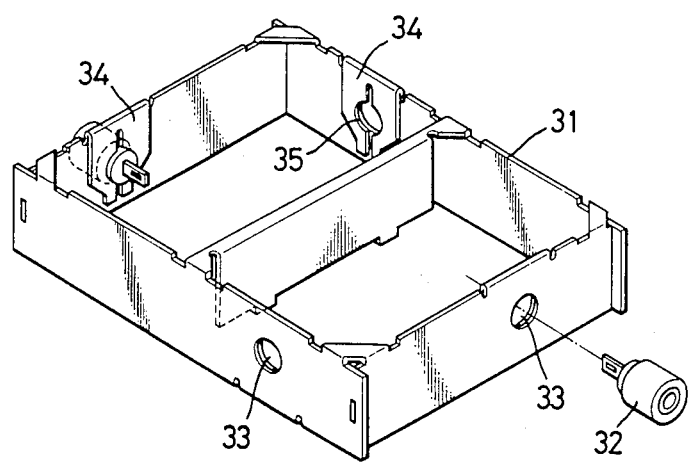
FIG. 1 is a perspective exploded view of a first embodiment of a mounting structure of the invention which is used for mounting a connector terminal to a frame.
Figure 2:
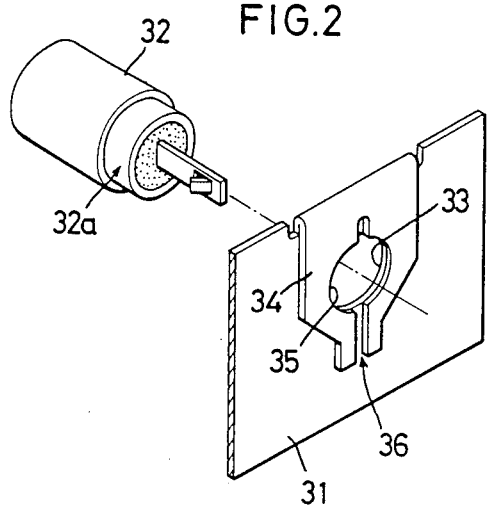
FIG. 2 is a perspective enlarged exploded partial view of a portion of the FIG. 1 embodiment.
Figure 3:
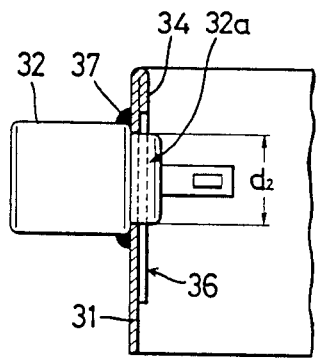
FIG. 3 is a longitudinal sectional side view of the portion of FIG. 2.

Referring to FIGS. 1 through 3, the first embodiment is shown which mounts a connector terminal 32 on a frame 31 used for a community antenna television system convertor.

Figure 4:
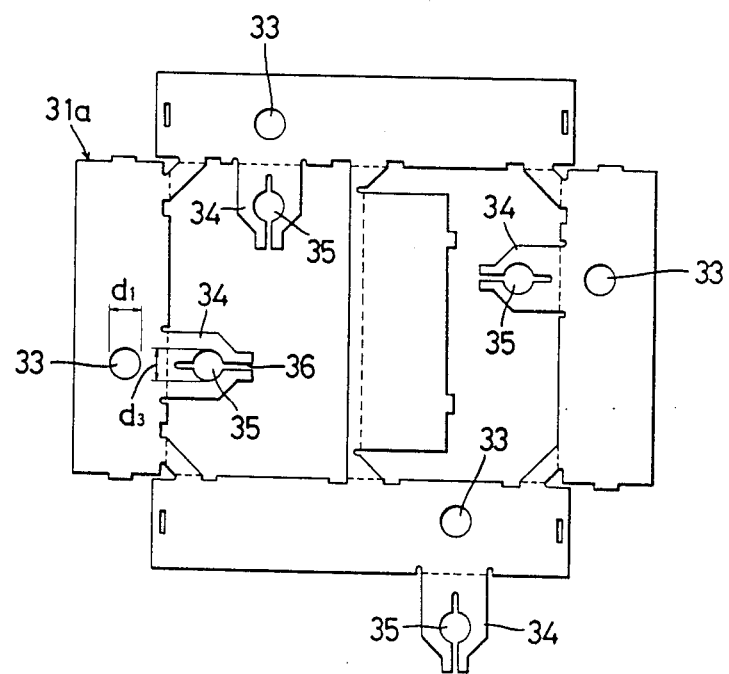
FIG. 4 is a developmental plan view of a frame material plate.

The frame 31, as shown in FIG. 4, is formed of a raw material plate 31a which is punched, bent and jointed to be a rectangular box, and at the four side walls thereof are formed mounting bores 33 respectively.

A diameter $d_1$ of each mounting bore 33 is made slightly larger than that $d_2$ of a smaller diameter portion 32a of the connector terminal 32.

A tongue 34 of width larger than the diameter $d_1$ of the mounting bore 33 is provided integrally with an edge of the side wall of frame 31.

The tongue 34 is bent inwardly into the interior of frame 31 and folded over the mounting bore 33 and provided with a terminal retaining bore 35 concentric with the mounting bore 33.

The terminal retaining bore 35 has a diameter $d_3$ slightly smaller than diameter $d_2$ of the smaller diameter portion 32a at the terminal 32, and at one side of the terminal retaining bore 35 a cutout 36 is formed at the inwardly bent free end of the tongue 34. The cutout 36 allows the degree of opening of the terminal retaining bore 35 to increase or decrease.

In the aforesaid construction, the connector terminal 32 is fitted at its smaller diameter portion 32a from the exterior into the mounting bore 33. Then, the smaller diameter portion 32a is insertably retained by the tongue 34 by enlarging the terminal retaining bore 35. The terminal 32 is elastically rigidly by the tongue 34 so as to eliminate play. Then, solder 37 is deposited around the retained portion of terminal 32 to thereby completely mount the terminal 32 on the frame 31.

Figure 5:
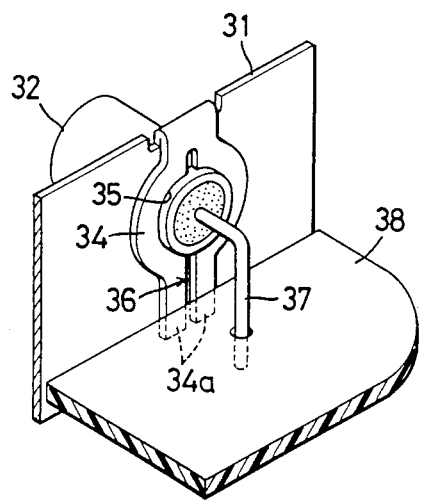
FIG. 5 is a partial perspective view of a second embodiment of the invention.
Figure 6:
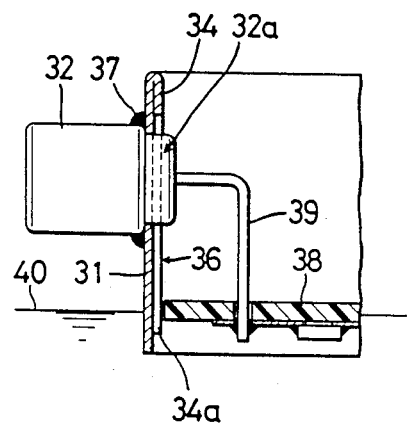
FIG. 6 is a longitudinal sectional view of the second embodiment taken through FIG. 5.

Referring to FIGS. 5 and 6, a second embodiment of the invention is shown, in which a bent tongue 34 extends at the free end thereof downwardly beyond a circuit substrate 38 fixed within the frame 31. Accordingly, when the frame 31 is dipped at the lower portion thereof into a solder bath 40 in order to fix the circuit substrate 38 to the frame 31, connect a lead 39 of terminal 32 to the circuit substrate 38, and mount additional parts (not shown), the molten solder enters by capillary action into a gap between the tongue 34 and side wall of frame 31. The molten solder is thus able to reach the outer periphery of the smaller diameter portion 32a of terminal 32, thereby enabling terminal 32 to be simultaneously fixed to the frame 31.

Figure 7:
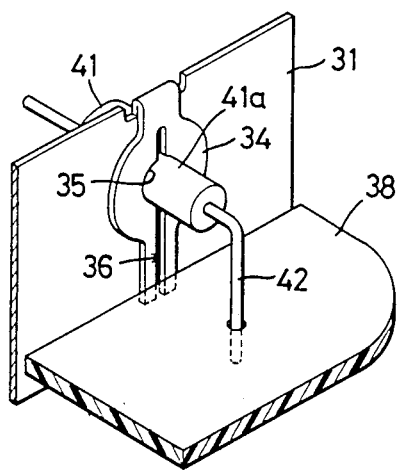
FIG. 7 is a perspective view of a portion of the second embodiment of FIG. 5, used to mount a feedthrough capacitor to a frame.
Figure 8:
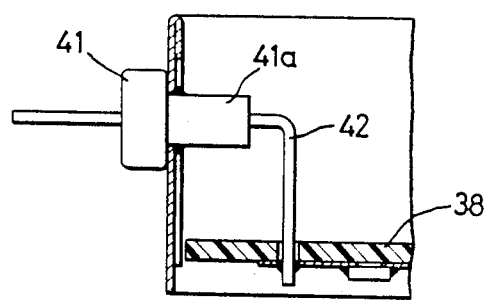
FIG. 8 is a longitudinal sectional view of the portion of FIG. 10.

Referring to FIGS. 7 and 8, a feedthrough capacitor 41 is mounted to the frame 31 through the second embodiment of the mounting structure of the invention. A smaller diameter portion 41a of feedthrough capacitor 41 is fitted from the exterior into a mounting bore 33 so that a tongue 34, the same as the embodiment, is temporarily held in a retaining bore 35 and then soldered thereto. Then, the feedthrough capacitor 41 is soldered at its lead 42 to a circuit pattern on circuit substrate 38.

Figure 9:
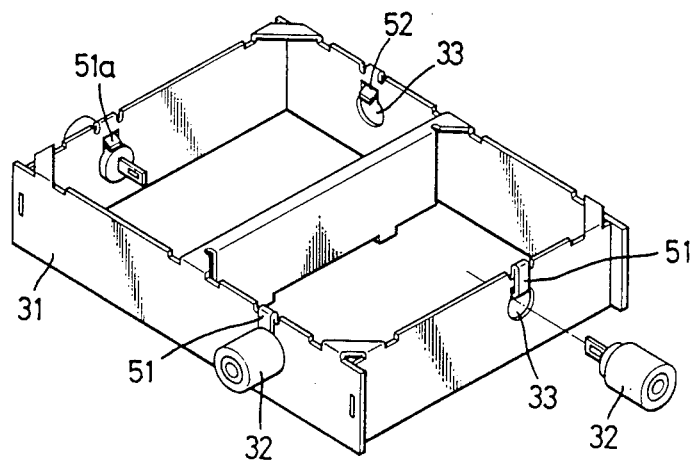
FIG. 9 is a perspective exploded view of a third embodiment of a mounting structure of the invention, by which a connector terminal is mounted on a frame.
Figure 10:
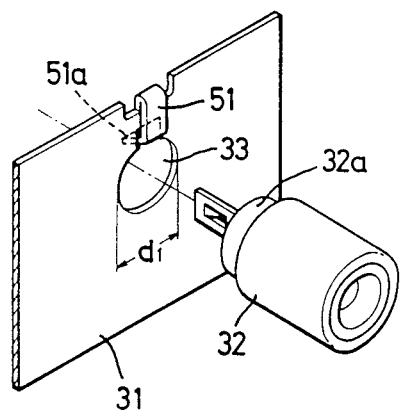
FIG. 10 is a perspective exploded partial view of a portion of the third embodiment of FIG. 9.
Figure 11:
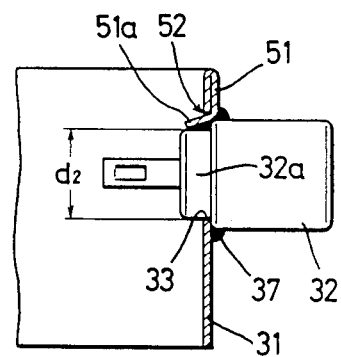
FIG. 11 is a longitudinal sectional view of FIG. 10.
Figure 12:
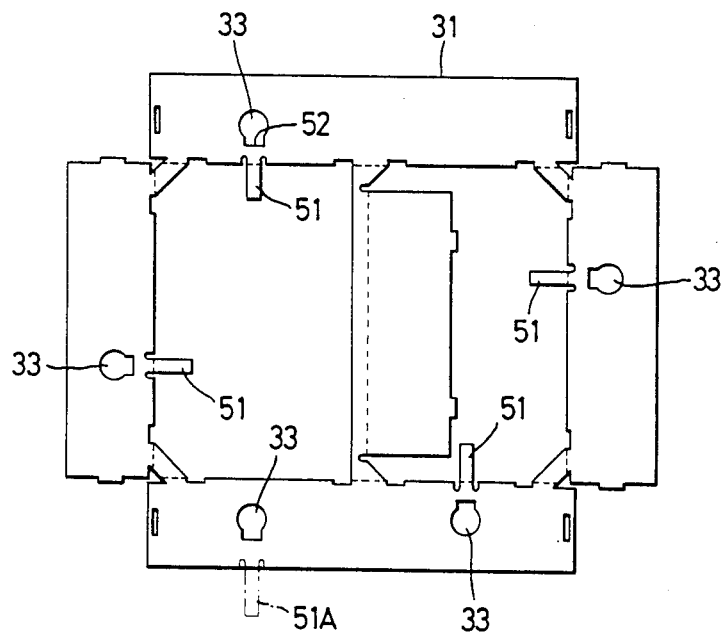
FIG. 12 is a developmental plan view of a frame material plate used for the embodiment of FIG. 9.

Referring to FIGS. 9 through 11, a third embodiment of the mounting structure of the invention is shown, which is used to mount a connector terminal 32 to the frame 31. FIG. 12 shows the frame 31 in development.

In the third embodiment, a tongue 51 of small width is integral with the frame 31 at a portion of the edge of a side wall thereof and is close to the mounting bore 33.

The tongue 51 is folded over the outer surface of the side wall of the frame 31 and the utmost free end 51a of the folded tongue 51 is further bent at a certain angle inwardly of the frame 31 through a recess formed at a circumferentially upper portion of the mounting bore 33.

In the aforesaid construction, the connector terminal 32, as shown in FIG. 10, is fitted from the exterior into the mounting bore 33. Then, the smaller diameter portion 32a of terminal 32 abuts the free end 51a of tongue 51 and elastically deforms it, thereby being press-fitted into the mounting bore 33.

Accordingly, the terminal 32, as shown in FIG. 11, is retained in frame 31 through the mounting bore 33 by means of an elastic reaction of the tongue 51 thus eliminating play. In this condition, solder 37 is deposited around the fitted portion of the terminal 32 onto mounting bore 33, thereby completely mounting connector terminal 32 to frame 31.

Figure 13:
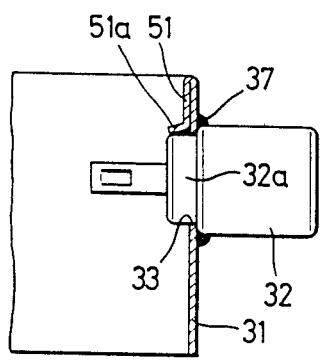
FIG. 13 is a longitudinal sectional view of a fourth embodiment of a mounting structure of the invention.

Referring to FIG. 13, a fourth embodiment of the invention is shown, which is different from the third embodiment of FIG. 11 in that a tongue 51 is folded over the inner surface of the side wall thereof and also bent at the free end 51a to project inwardly of the frame 31. In this case, the mounting bore 33 may have no recess.

Thus, the smaller diameter portion 32a of terminal 32 is retained in the mounting bore 33 by an elastic reaction of the inwardly projecting free end 51a of tongue 51, thus eliminating play.

In this state, solder 37 is deposited around the fitted portion of the terminal 32, thereby completely mounting terminal 32 to frame 31.

Figure 14:
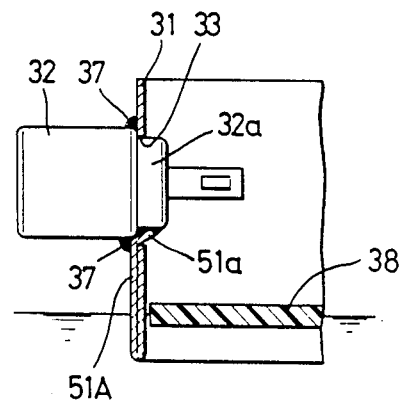
FIG. 14 is a longitudinal sectional view of a fifth embodiment of a mounting structure of the invention.

Referring to FIG. 14, a fifth embodiment of the invention is shown, which is a modification of the third embodiment. The fifth embodiment is provided at the lower edge of the side wall of frame 31 with a tongue 51A integral therewith as shown by the dashed line in FIG. 12, the tongue 51A being folded over the outer surface of the side wall of the frame 31 and further bent at the free end inwardly into frame 31.

Figure 15:
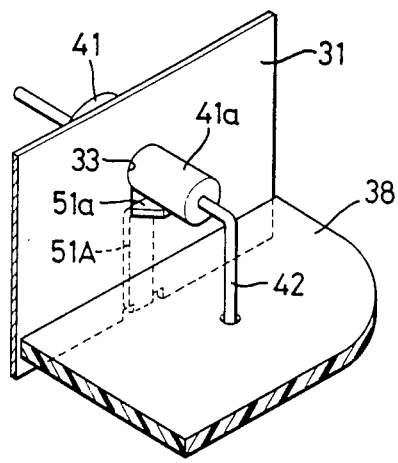
FIG. 15 is a perspective partial view of the fifth embodiment, by which a feedthrough capacitor is mounted on a frame.
Figure 16:
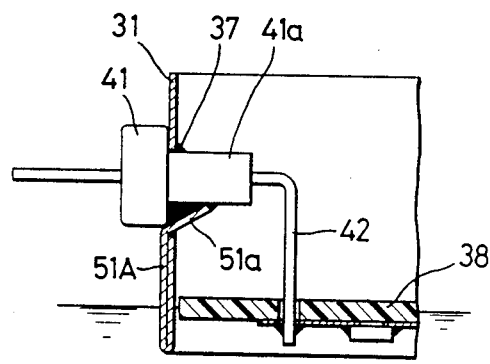
FIG. 16 is a longitudinal sectional view of the fifth embodiment, corresponding to FIG. 15.

Referring to FIGS. 15 and 16, the fifth embodiment of the mounting structure of the invention is used to mount a feedthrough capacitor 41 on the frame 31. The fifth embodiment in FIGS. 14, 15 and 16, in the same manner as the second embodiment, allows the molten solder to enter a gap between the tongue 51A and the frame 31 by capillary action so as to reach the peripheral portion of the smaller diameter portion 32a or 41a of terminal 32 or feedthrough capacitor 41, thereby fixedly soldering the terminal 32a feedthrough capacitor 41 to the frame 31 when dipped in the solder bath for soldering a lead 42 and others.

Figure 17:
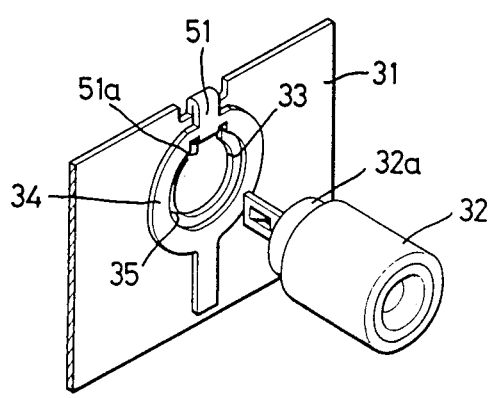
FIG. 17 is a perspective exploded view of a sixth embodiment of a mounting structure of the invention.
Figure 18:
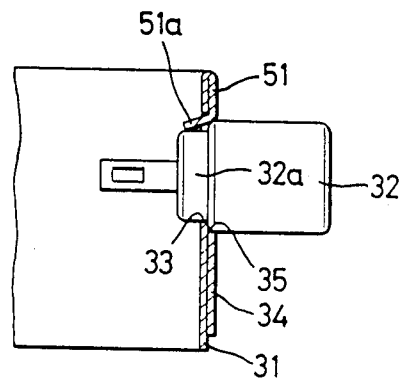
FIG. 18 is a longitudinal sectional view thereof.
Figure 19:
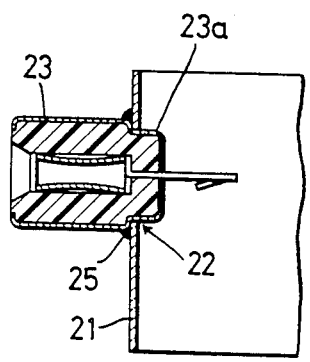
FIG. 19 is a longitudinal sectional view of a PRIOR ART mounting structure, by which a connector terminal is mounted on the frame.
Figure 20:
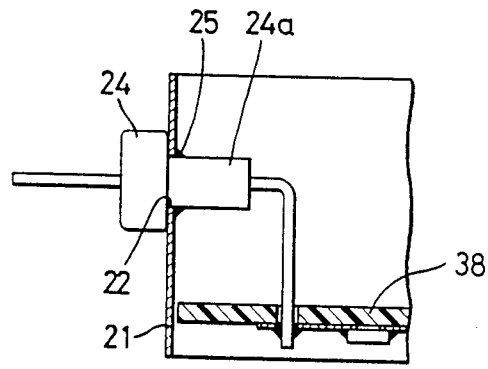
FIG. 20 is a longitudinal sectional view of a PRIOR ART mounting structure, by which a feedthrough capacitor is mounted on the frame.

Referring to FIGS. 17 and 18, a sixth embodiment of the invention is shown, which is a combination of the second embodiment in FIGS. 5 and 6 and the third embodiment in FIGS. 10 and 11 and includes a tongue 34 integral with the frame 31. The tongue 34 is folded over the outer surface of the side wall of frame 31, and provided with a retaining bore 35 and at the inner periphery thereof with a small cooperating tongue 51 projecting inwardly of the frame 31, thereby enabling the temporarily elastic fixing of the connector terminal 32 to the frame 31 simultaneously with the fixedly soldering the same to the frame 31 through capillary action of drawing molten solder into the gap between the tongue 34 and the frame 31. Unlike the second embodiment, there is no cut-out portion in the ring-shaped tongue of the sixth embodiment. The properly sized retaining bore 35 cooperates with an inwardly bent free end 51a of small tongue 51 to fixedly secure connector terminal 32 for soldering as described immediately above.

As seen from the above, the mounting structure of the present invention uses a tongue integral with the frame and folded thereover to thereby temporarily fix the terminal or feedthrough capacitor thereto. Hence, the component can reliably be held in the desired position without using any particular jig, and then fixedly soldered to the frame, thereby improving the efficiency of mounting component to the frame.

Also, the tongue for temporarily fixing the electronic parts can be formed simultaneously with the punching of the frame from the raw material plate, thereby lowering production costs.

Although several embodiments have been described, they are merely exemplary of the invention and not to be construed as limiting the invention which is defined solely by the appended claims.

What is claimed is:

1. A mounting structure for fixedly securing electronic parts comprising
    a frame having a mounting bore for receiving an electronic part therein;
    a tongue integrally attached at one end thereof to said frame, and having a free end thereof substantially parallel to and adjacent said frame;
    a retaining bore in said tongue, the diameter of said retaining bore being smaller than the diameter of said mounting bore of said frame, said retaining and mounting bores being substantially aligned for receiving an electronic part therein;
    a cutout in said free end of said tongue, said cutout extending from said retaining bore to the outermost portion of said free end of said tongue, said cutout providing elastic expansion of said free end of said tongue for fixedly securing an electronic part receivable in said retaining and mounting bores.

2. A mounting structure as in claim 1, wherein said frame comprises an enclosed perimeter, said frame encloses a circuit substrate therein, and said free end of said tongue extends between said frame and said circuit substrate and defines a gap between said frame and said tongue for drawing up molten solder into said gap by capillary action.

3. A mounting structure for fixedly securing electronic parts comprising
    a frame having a mounting bore for receiving electronic parts therein,
    a tongue integrally attached to said frame at one end thereof, and having a free end at the other end thereof,
    a retaining bore in said tongue for securing an electronic part therein, said retaining and mounting bores being substantially aligned for receiving an electronic part therein;
    a small tongue integrally attached to said tongue, extending into said retaining bore in said tongue, extending into said mounting bore of said frame, and engageable by an electronic part received in said retaining and mounting bores for fixedly retaining the electronic part.

* * * * *